US011832390B2

(12) United States Patent
Wang et al.

(10) Patent No.: US 11,832,390 B2
(45) Date of Patent: Nov. 28, 2023

(54) MULTILAYER COPPER BUS BARS WITH SOLDERED THROUGH HOLE COMPONENTS

(71) Applicant: Rolls-Royce Corporation, Indianapolis, IN (US)

(72) Inventors: Shuai Wang, Singapore (SG); Chandana J. Gajanayake, Singapore (SG); David R. Trawick, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 59 days.

(21) Appl. No.: 17/688,473

(22) Filed: Mar. 7, 2022

(65) Prior Publication Data
US 2023/0284387 A1 Sep. 7, 2023

(51) Int. Cl.
H05K 1/18 (2006.01)
H05K 3/34 (2006.01)

(52) U.S. Cl.
CPC .............. *H05K 1/18* (2013.01); *H05K 3/3447* (2013.01); *H05K 2201/09854* (2013.01); *H05K 2201/10015* (2013.01); *H05K 2201/10901* (2013.01)

(58) Field of Classification Search
CPC .................. H05K 1/18; H05K 3/3447; H05K 2201/09854; H05K 2201/10015; H05K 2201/10901
USPC .......................................................... 174/260
See application file for complete search history.

(56) References Cited

U.S. PATENT DOCUMENTS

| | | | |
|---|---|---|---|
| 4,430,522 A | 2/1984 | Bader | |
| 4,584,768 A | 4/1986 | Tosti | |
| 6,538,878 B1 | 3/2003 | Acker et al. | |
| 7,092,238 B2 | 8/2006 | Saito et al. | |
| 7,529,076 B2 | 5/2009 | Saito et al. | |
| 7,557,298 B2 | 7/2009 | Vanhoutte et al. | |
| 8,134,070 B2 | 3/2012 | Hirschfeld | |
| 9,270,091 B2 | 2/2016 | Erdle et al. | |
| 9,520,235 B2 | 12/2016 | Hwang et al. | |
| 10,128,045 B2 | 11/2018 | Sasaki | |
| 10,475,585 B2 | 11/2019 | Sato et al. | |
| 10,658,941 B2 | 5/2020 | Dame et al. | |
| 10,907,268 B2 | 2/2021 | Nakagawa et al. | |
| 2011/0149472 A1 | 6/2011 | Yang et al. | |
| 2017/0311433 A1* | 10/2017 | Sumida | H05K 1/0203 |
| 2019/0343007 A1* | 11/2019 | Sasaki | H05K 3/306 |
| 2021/0217558 A1 | 7/2021 | Nakao et al. | |

FOREIGN PATENT DOCUMENTS

| | | |
|---|---|---|
| CN | 105321710 | 2/2016 |
| CN | 105702456 | 6/2016 |
| KR | 20110030762 | 3/2011 |

* cited by examiner

*Primary Examiner* — Andargie M Aychillhum
(74) *Attorney, Agent, or Firm* — Barnes & Thornburg LLP

(57) ABSTRACT

An electrical assembly, such as a multi-layer bus bar, includes an electrical connection pin and a plurality of electrically conductive layers. Each of the electrically conductive layers is formed to define a cutout therein to receive the electrical connection pin and allow access for joining material to join the electrical connection pin with the plurality of electrically conductive layers. Each of the cutouts is formed to include a first portion arranged around the electrical connection pin and a second portion located radially outward of the first portion.

20 Claims, 6 Drawing Sheets

MULTILAYER COPPER BUS BARS WITH SOLDERED THROUGH HOLE COMPONENTS

FIELD OF THE DISCLOSURE

The present disclosure relates generally to electronic components, and more specifically to features and methods for soldering multilayer electronic components.

BACKGROUND

In aerospace applications, power electronic converter designs may demand high power density in terms of weight and volume. One commonly adopted approach to reduce the DC link capacitance is to increase the power converter's switching frequency. However, with increasing switching frequency, the alternating current through the DC link capacitors increase accordingly. With increased frequency, current crowing occurs in the DC link of conventional bus bars where the electrical current only flows to the surface of copper layers to certain depth, which is termed the skin-depth. Moreover, film capacitors may be utilized more and more in aerospace power converters.

The combination of conventional through-hole rectangle capacitors and conventional multilayer copper bus bar or printed circuit boards create the challenge of reliable soldering. The top most layer of conventional components may be the most assessable for soldering while the inner layers may be difficult to reach with conventional soldering method. The soldering quality of conventional components may be poor where the inner layers are barely attached to the capacitor pins.

SUMMARY

The present disclosure may comprise one or more of the following features and combinations thereof.

A multi-layer bus bar assembly according to the present disclosure includes a capacitor and a multi-layer bus bar. The capacitor having a body and a first electrical connection pin that extends away from the body along an axis. The multi-layer bus bar includes a positive rail, a negative rail, and a main insulation layer. The positive rail includes a plurality of first conductive layers and a plurality of first inter-insulation layers. Each of the plurality of first inter-insulation layers is located axially between neighboring first conductive layers included in the plurality of first conductive layers. The negative rail includes a plurality of second conductive layers and a plurality of second inter-insulation layers. Each of the plurality of second inter-insulation layers is located axially between neighboring second conductive. The main insulation layer is positioned between the positive rail and the negative rail.

In illustrative embodiments, the plurality of first conductive layers are formed to assist in the joining of the plurality of first conductive layers with the first electrical connection pin. The plurality of first conductive layers may include a first layer and a second layer axially neighboring the first layer. The first layer is formed to define a first cutout shaped with a soldering pattern arranged about the axis. The second layer is formed to define a second cutout shaped with the soldering pattern. In illustrative embodiments, the soldering pattern includes a first portion that extends circumferentially at least partway around the first electrical connection pin at a first radial distance relative to the axis and a second portion that extends circumferentially at least partway about the first electrical connection pin at a second radial distance relative to the axis.

In some embodiments, the second cutout formed in the second conductive layer is offset circumferentially about the axis relative to the first cutout formed in the first conductive layer. In some embodiments, the first portion fluidly opens into the second portion. In some embodiments, the second cutout is offset circumferentially from the first cutout by less than 90 degrees relative to the axis.

In some embodiments, the first portion of the solder pattern extends circumferentially only partway around the axis. The first distance provides the first portion with a constant radius.

In some embodiments, the second portion of the solder pattern extends circumferentially only partway around the axis. The second distance provides the second portion with a constant radius.

In some embodiments, the second portion of the solder pattern extends circumferentially less than 90 degrees around the axis. In some embodiments, the second portion of the solder pattern extends circumferentially at least 90 degrees around the axis.

In some embodiments, the solder pattern further includes a third portion that extends circumferentially at least partway about the first electrical connection pin at a third radial distance relative to the axis. The third radial distance is greater than the first radial distance.

According to another aspect, a multi-layer electrical component assembly includes an electrical connection pin that extends along an axis, a first conductive layer, and a second conductive layer. The first conductive layer is formed to define a first cutout that extends axially through the first conductive layer. The first cutout includes a first portion arranged around the electrical connection pin and a second portion located radially outward of the first portion. The second conductive layer axially neighbors the first conductive layer. The second conductive layer is formed to define a second cutout that extends axially through the second conductive layer. The second cutout includes a third portion arranged around the electrical connection pin and a fourth portion located radially outward of the third portion. The fourth portion is at least partially circumferentially aligned with the second portion of the first cutout to allow joining material to be provided axially between the fourth portion and the second portion.

In some embodiments, the second cutout is substantially the same as the first cutout. The second cutout is offset circumferentially relative to the first cutout about the axis.

In some embodiments, the first portion extends circumferentially partway about the axis at a first constant radius. The second portion extends circumferentially partway about the axis at a second constant radius that is different than the first constant radius.

In some embodiments, the second portion opens fluidly into first portion to form a single opening through the first conductive layer. In some embodiments, the second portion is entirely spaced apart radially from the first portion so that each of the first portion and the second portion form an opening that extends axially through the first conductive layer.

In some embodiments, the first cutout is defined in part by a first side wall and a second side wall that diverge as they extend radially away from the axis.

In some embodiments, the first conductive layer includes a plurality of side walls that extend axially entirely through the first conductive layer and define the first cutout. The plurality of first side walls include a first side wall that extends circumferentially at least partway about the axis, a second side wall that extends circumferentially at least partway about the axis, and a third side wall that extends radially between and interconnects the first side wall and the second side wall.

According to another aspect, a method of making a multi-layer bus bar assembly includes a number of steps. The method includes arranging a first cutout formed in a first electrically conductive layer around an electrical connection pin that extends along an axis, the first cutout having a first portion that extends circumferentially at least partway around the electrical connection pin relative to the axis and a second portion located radially outward from the first portion, arranging a second cutout formed in a second electrically conductive layer around the electrical connection pin, the second cutout having a third portion that extends circumferentially at least partway around the electrical connection pin relative to the axis and a fourth portion located radially outward from the second portion, applying joining material in the first portion of the first cutout to cause the joining material to engage the first electrically conductive layer and the electrical connection pin, and applying the joining material in the second portion of the first cutout to cause a portion of the joining material to pass through the second portion of the first cutout and enter the fourth portion of the second cutout to allow the joining material to engage the second electrically conductive layer.

In some embodiments, the third portion of the second cutout is radially open to and fluidly connected with the fourth portion to allow the joining material into the fourth portion and into the third portion. In some embodiments, the second portion of the first cutout has an area that is larger than an area of the first portion. In some embodiments, the second cutout is substantially the same shape as the first cutout and rotated circumferentially partway about the axis relative to first cutout.

These and other features of the present disclosure will become more apparent from the following description of the illustrative embodiments.

DETAILED DESCRIPTION OF THE DRAWINGS

Figure 1:
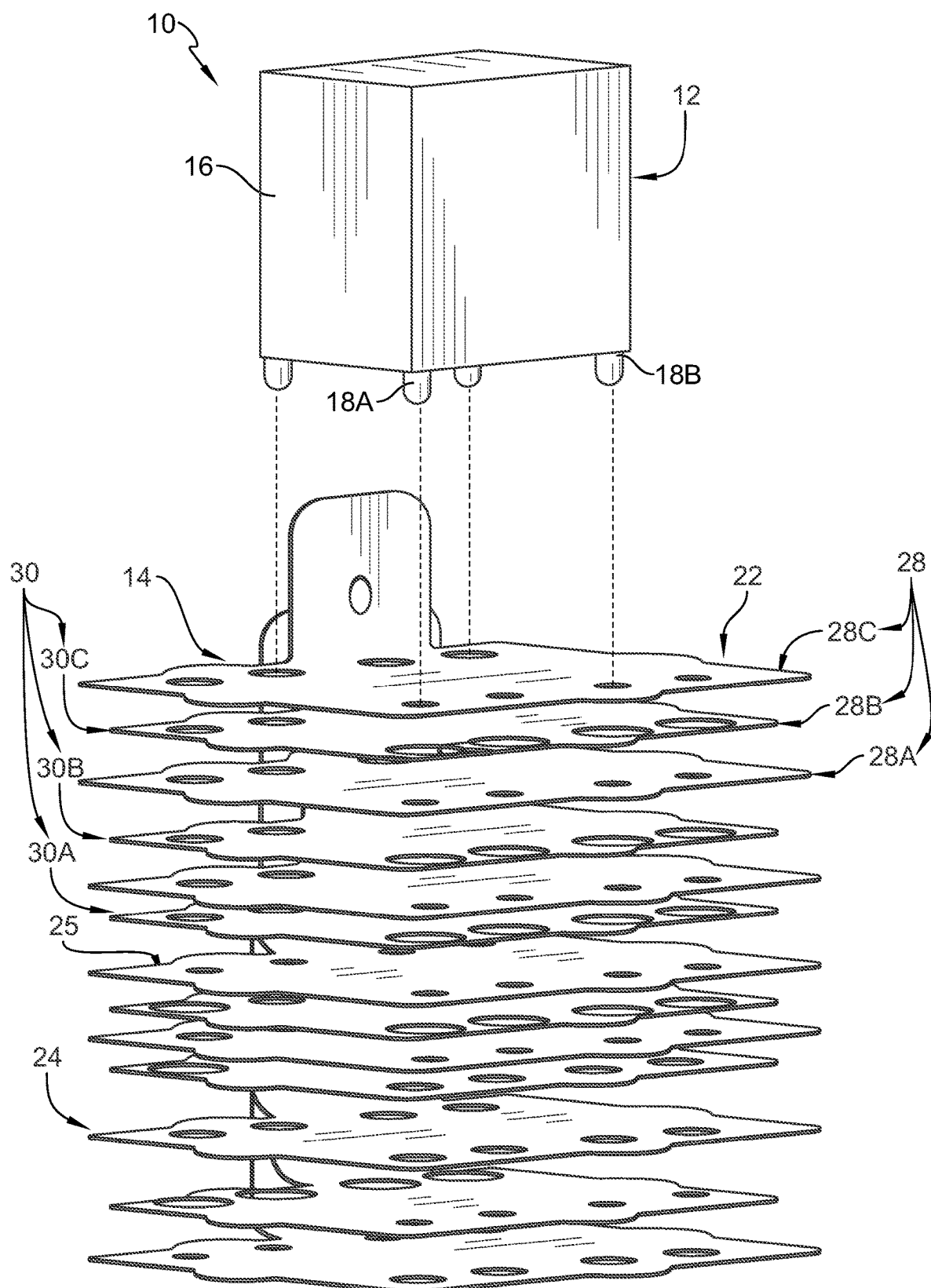
FIG. 1 is an exploded perspective view of a multi-layer electrical component assembly, the illustrative assembly being a multi-layer bus bar assembly having a capacitor and a plurality of conductive layers configured to be soldered with the capacitor.

For the purposes of promoting an understanding of the principles of the disclosure, reference will now be made to a number of illustrative embodiments illustrated in the drawings and specific language will be used to describe the same.

A multi-layer electrical component assembly 10 for use with gas turbine engines is shown in FIG. 1. The multi-layer electrical component assembly 10 may be, for example, a multi-layer bus bar or printed circuit board (PCB). The multi-layer electrical component assembly 10 includes a plurality of conductive layers 28 having cutouts 32, 34, 36, etc. formed therein to assist in the joining or soldering of the conductive layers 28 with another electrical component such as a connection pin 18A.

Figure 4:
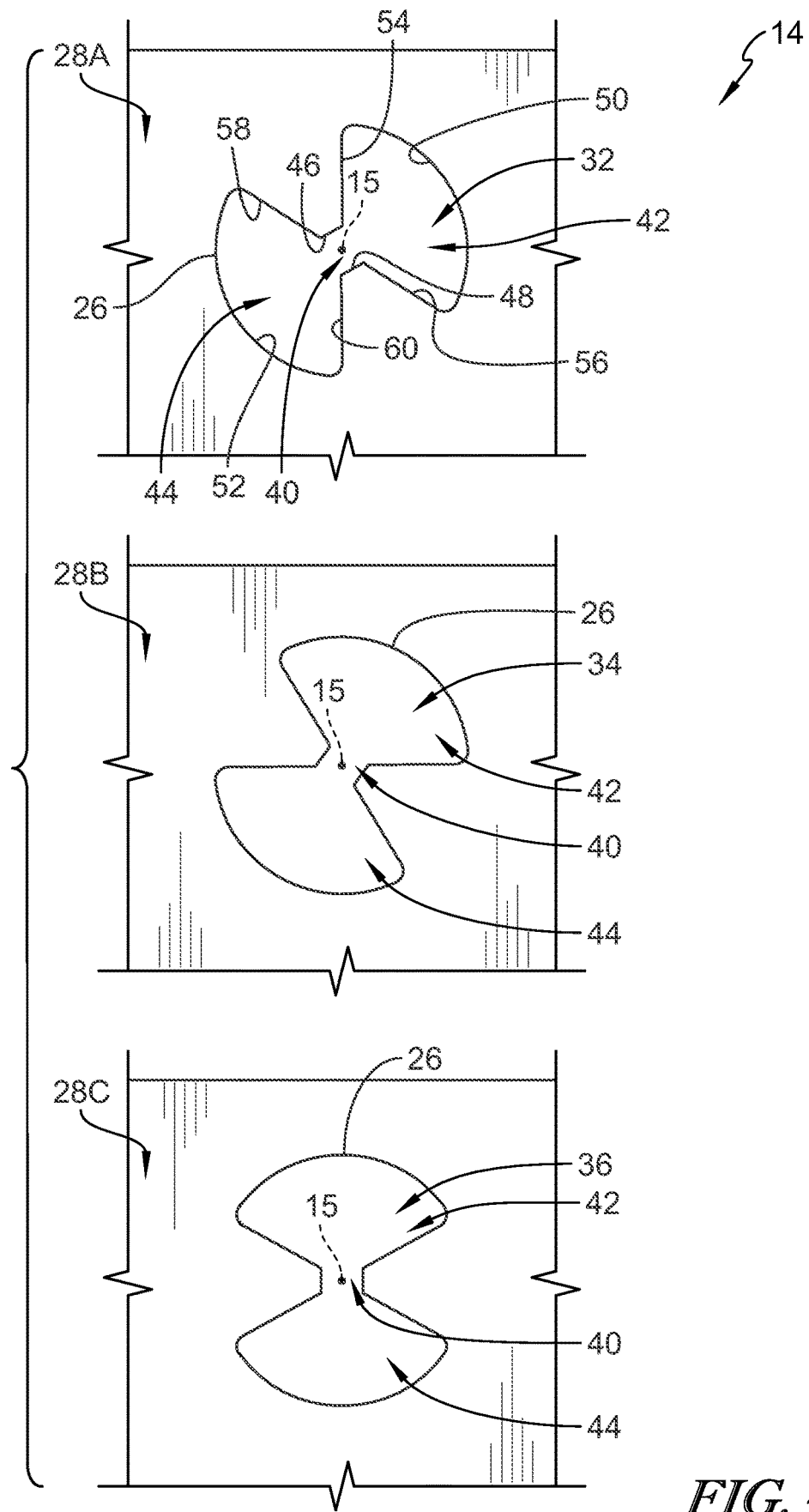
FIG. 4 is an exploded view of the plurality of conductive layers of the multi-layer bus bar assembly showing that each layer is formed to define a cutout with the solder pattern whereby the solder pattern is offset circumferentially relative to an axis for each layer.

Each of the cutouts 32, 34, 36, etc. is shaped as a soldering pattern 26 as shown in FIG. 4. The soldering pattern 26 includes a first portion 40 arranged around the connection pin 18A or other electrical component and a second portion 42 located outward of the first portion 40 and configured to allow the solder or other bonding material 31 to be provided between the conductive layers 28.

Figure 2:
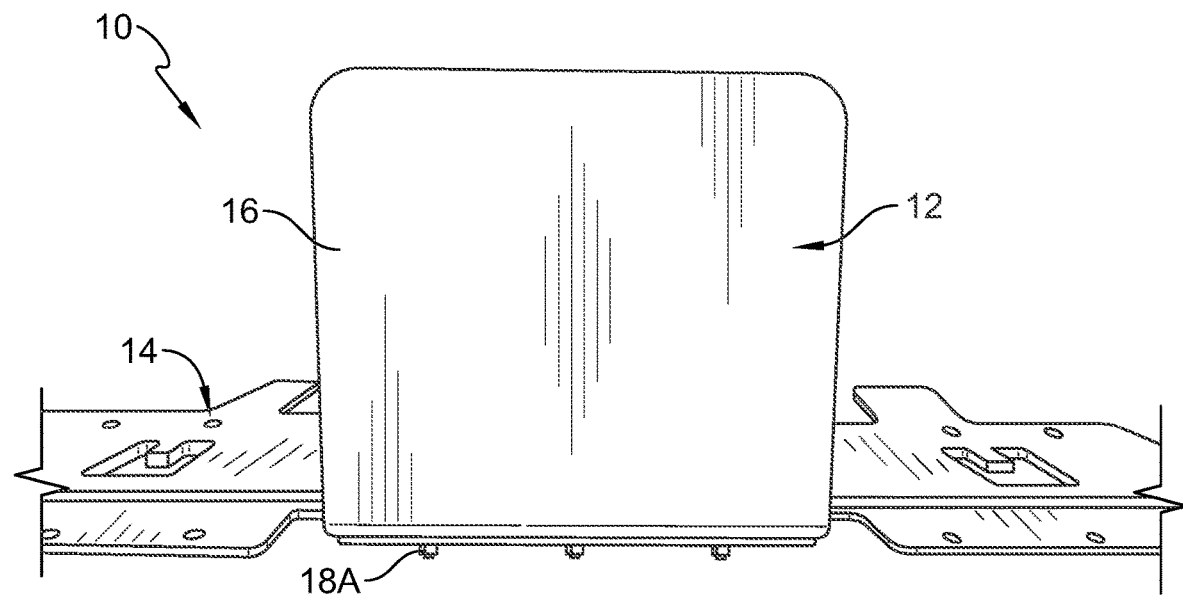
FIG. 2 is top view of the multi-layer bus bar assembly of FIG. 1 showing the capacitor soldered with the plurality of conductive layers.

The illustrative multi-layer electrical component assembly 10 is a multi-layer bus bar assembly as shown in FIG. 1. However, the features of the present disclosure are applicable to other multi-layer electrical component assemblies such as, for example, printed circuit boards. The multi-layer electrical component assembly 10 includes a capacitor 12 and a multi-layer bus bar 14 (sometimes called a laminated bus bar) coupled with the capacitor 12 as shown in FIG. 2.

The capacitor 12 is illustratively a film capacitor. The capacitor 12 includes a body 16 having the capacitor internals therein and one or more electrical connection pins 18A, 18B, etc. that extend away from the capacitor body 16. Each electrical connection pin 18A, 18B, etc. extends away along a respective axis 15.

The multi-layer bus bar 14 includes a positive rail 22, a negative rail 24, and a main insulation layer 25 as shown in FIG. 1. The positive rail 22 is joined with at least one of the electrical connection pins 18A of the capacitor 12. The negative rail 24 is joined with at least one other of the electrical connection pins 18B of the capacitor 12. The main insulation layer 25 is non-conductive and located between the positive rail 22 and the negative rail 24.

The positive rail 22 includes a plurality of first conductive layers 28 and a plurality of first inter-insulation layers 30 engaged with the first conductive layers 28 as shown in FIG. 1. The plurality of first conductive layers 28 is made of a conductive material such as copper, for example. At least one layer of the plurality of first inter-insulation layers 30 is located axially between neighboring first conductive layers 28 to provide a non-conductive insulation between the neighboring first conductive layers 28. Illustratively, the plurality of first inter-insulation layers 30 are directly engaged with the first conductive layers 28.

As an example, the plurality of first conductive layers 28 includes a first conductive layer 28A, a second conductive layer 28B, and a third conductive layer 28C as shown in FIG. 1. The plurality of first inter-layer insulation layers 30 include a first insulation layer 30A, a second insulation layer 30B, and a third insulation layer 30C. The first insulation layer 30A is between the first conductive layer 28A and the main insulation layer 25. The second insulation layer 30B is located axially between neighboring conductive layers 28A, 28B. The third insulation layer 30C is located axially between the second conductive layer 28B and the third conductive layer 28C. The main insulation layer 25 is engaged with the conductive layer 28A. In other embodiments, the plurality of first conductive layers 28 include any number of layers and the plurality of first inter-insulation layers 30 include a number of layers correlated with the conductive layers 28.

The plurality of first conductive layers 28 are formed to assist in the joining of the plurality of first conductive layers 28 with the first electrical connection pin 18A. The first conductive layer 28A is formed to define a first cutout 32 shaped with a soldering pattern 26 arranged about the axis 15 as shown in FIG. 4. The second conductive layer 28B is formed to define a second cutout 34 shaped with the same soldering pattern 26. The third conductive layer 28C is formed to define a third cutout 36 shaped with the same soldering pattern 26.

Figure 3:
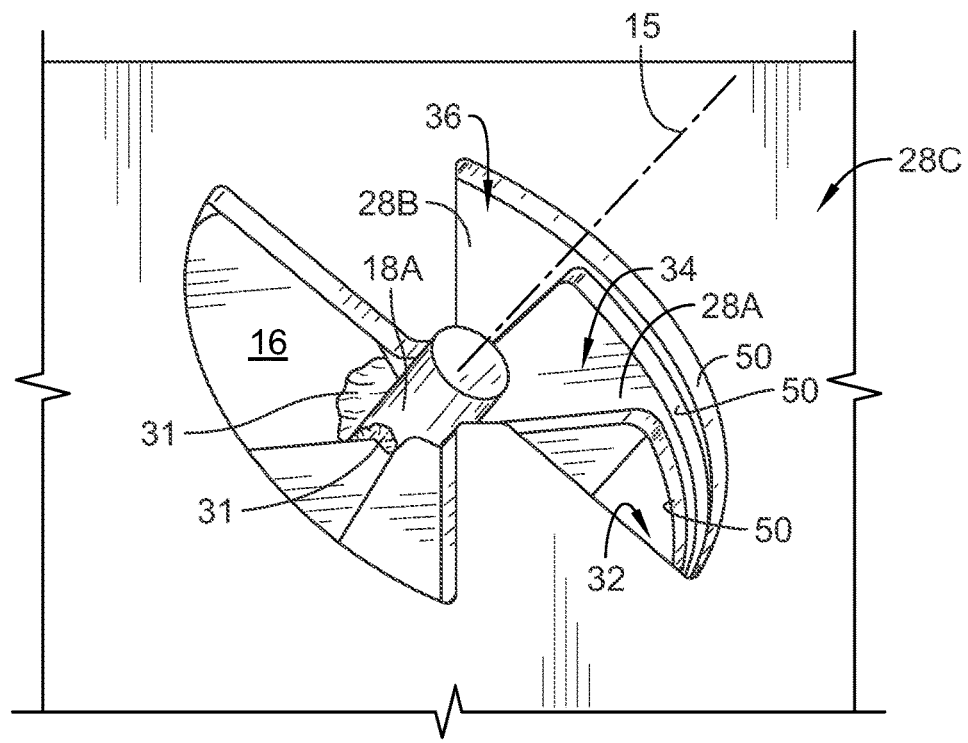
FIG. 3 is a perspective view of an electrical connection pin of the capacitor extending through cutouts formed in the plurality of conductive layers of the multi-layer bus bar assembly and suggesting that the cutouts have a similar solder pattern that is offset for each layer to provide additional surface area and improve the solder joint.

In the illustrative embodiment, the cutouts 32, 34, 36 are offset or misaligned circumferentially about the axis 15 relative to one another as shown in FIGS. 3 and 4. In other words, the shape of soldering pattern 26 is the same for each conductive layer 28A, 28B, 28C, but rotated partially around the axis 15 relative to the neighboring conductive layer 28A, 28B, 28C. In other embodiments, the cutouts 32, 34, 36 are substantially aligned circumferentially about the axis 15 relative to one another.

The soldering pattern 26 includes a first portion 40, a second portion 42, and a third portion 44 as shown in FIG. 4. The first portion 40 is aligned on the axis 15 and is sized to receive the electrical connection pin 18A. The first portion 40 extends circumferentially at least partway around the first electrical connection pin 18A at a first radial distance relative to the axis 15. The second portion 42 is located radially outward of the first portion 40 and extends at least partway about the first electrical connection pin 18A at a second radial distance relative to the axis 15. In the illustrative embodiment, the second portion 42 is wedge shaped. In the illustrative embodiment, the second portion 42 opens into the first portion 40 so that the first portion 40 and the second portion 42 are in fluid communication with one another to form a single opening. The third portion 44 is located radially outward of the first portion 40 opposite the second portion 42 and extends at least partway about the first electrical connection pin 18A at a third radial distance relative to the axis 15. The third radial distance is equal to the second radial distance in this embodiment. In the illustrative embodiment, the third portion 44 is wedge shaped. In the illustrative embodiment, the third portion 44 opens into the first portion 40 so that the first portion 40 and the third portion 44 are in fluid communication with one another.

In the illustrative embodiment, the second portion 42 extends less than 180 degrees around the axis 15. In some embodiments, the second portion 42 extends more than 180 degrees around the axis 15 and less than 360 degrees around the axis 15. In some embodiments, the second portion 42 extends less than 90 degrees around the axis 15. In some embodiments, the second portion 42 extends less than 45 degrees around the axis 15. In some embodiments, the second portion 42 extends less than 30 degrees around the axis 15. In other embodiments, the second portion 42 extends at least 90 degrees around the axis 15.

The cutout 32 includes a first inner wall 46, a second inner wall 48, a first outer wall 50, a second outer wall 52, a first intermediate wall 54, a second intermediate wall 56, a third intermediate wall 58, and a fourth intermediate wall 60 as shown in FIG. 4. The first inner wall 46 and the second inner wall 48 are curved and each extend partway circumferentially around the axis 15 at the first radius as shown in FIG. 4. The first inner wall 46 and the second inner wall 48 cooperate to define the first portion 40 of the soldering pattern 26. The first inner wall 46 and the second inner wall 48 are configured to be bonded directly with the electrical connection pin 18A with solder or other joining material 31.

The first outer wall 50 and the second outer wall 52 extend circumferentially partway around the axis 15 at the second radius as shown in FIG. 4. The first outer wall 50 and the second outer wall 52 are each curved walls and each extend less than 180 degrees around the axis 15.

The first intermediate wall 54 extends between and interconnects the first inner wall 46 and the first outer wall 50 as shown in FIG. 4. The second intermediate wall 56 extends between and interconnects the second inner wall 48 and the first outer wall 50. The first intermediate wall 54 and the second intermediate wall 56 diverge away from each other as they extend radially outward away from the axis 15.

The third intermediate wall 58 extends between and interconnects the first inner wall 46 and the second outer wall 52 as shown in FIG. 4. The fourth intermediate wall 60 extends between and interconnects the second inner wall 48 and the second outer wall 52. The third intermediate wall 58 and the fourth intermediate wall 60 diverge away from each other as they extend radially outward away from the axis 15.

As shown in FIG. 4, the solder pattern 26 is the same for each cutout 32, 34, 36 of the conductive layers 28A, 28B, 28C respectively. The same solder patterns 26 is rotated circumferentially about the axis 15 for each conductive layers 28A, 28B, 28C so that they are not aligned circumferentially. As shown in FIG. 3, the circumferential offset provides a stepped feature. Each of the first portions 40 of the conductive layers 28A, 28B, 28C are similarly sized and receive the electrical connection pin 18A. The second and third portions 42, 44 of the conductive layers 28A, 28B, 28C form the stepped features. As a result, a portion of each conductive layers 28A, 28B is exposed for the solder or joining material 31 to couple the conductive layers 28A, 28B, 28C with the electrical connection pin 18A. The second portions 42 are open to each other and open to the first portions 40 to allow the solder or joining material 31 to flow into the other second portions 42 and first portions 40 from one more second portions 42.

Figure 5:
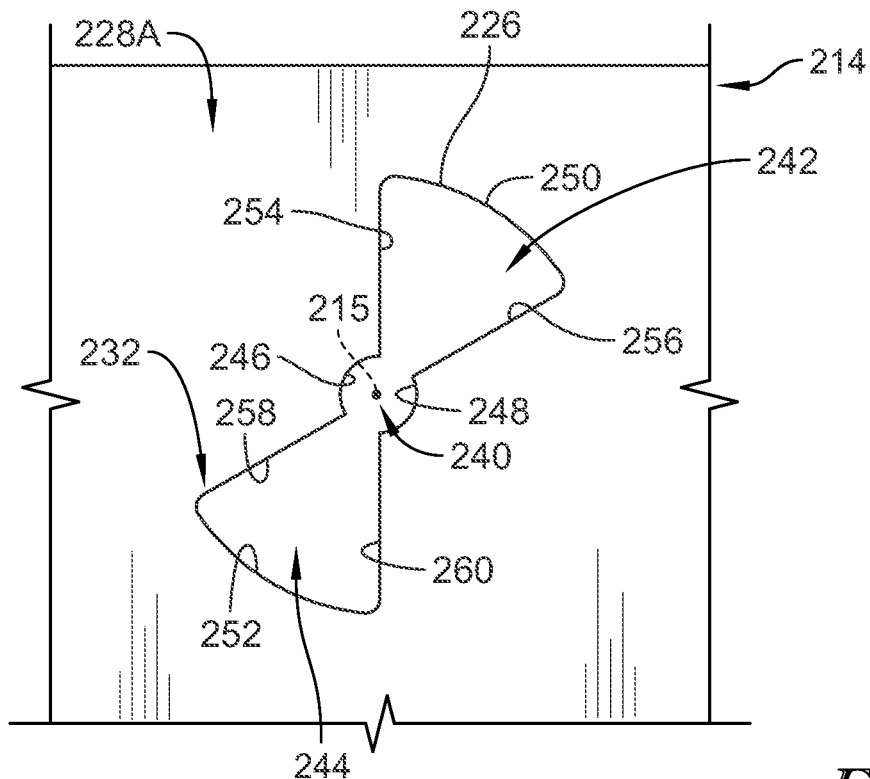
FIG. 5 is an elevation view of another solder pattern for use with the conductive layers of the multi-layer electrical component.

Another embodiment of a cutout 232 for conductive layers and having a solder pattern 226 is shown in FIG. 5. The cutout 232 is formed in a conductive layer 228A included in a plurality of conductive layers (not shown) for a multi-layer bus bar 214. Similar to the conductive layers 28, the conductive layers 228 each include a cutout having the same solder pattern 226, but with the pattern rotated partway around the axis 215 for each layer 228 so that the patterns are misaligned when viewed radially.

The soldering pattern 226 includes a first portion 240, a second portion 242, and a third portion 244 as shown in FIG. 5. The first portion 240 is aligned on the axis 215 and is sized to receive the electrical connection pin 18A. The second portion 242 is located radially outward of the first portion 240 and extends at least partway about the first electrical connection pin 18A at a second radial distance relative to the axis 215. The third portion 244 is located radially outward of the first portion 240 opposite the second portion 242 and extends at least partway about the first electrical connection pin 18A at a third radial distance relative to the axis 215.

In the illustrative embodiment, the second portion 242 extends about or less than 90 degrees around the axis 215. In some embodiments, the second portion 242 extends about or less than 70 degrees around the axis 215. In some embodiments, the second portion 242 extends about or less than 60 degrees around the axis 215. In some embodiments, the second portion 242 extends about or less than 50 degrees around the axis 215. In some embodiments, the second portion 242 extends about or less than 45 degrees around the axis 215. In some embodiments, the second portion 242 extends about or less than 30 degrees around the axis 215.

Similar to the cutout 32, the cutout 232 includes a first inner wall 246, a second inner wall 248, a first outer wall 250, a second outer wall 252, a first intermediate wall 254, a second intermediate wall 256, a third intermediate wall 258, and a fourth intermediate wall 260 as shown in FIG. 5. The first inner wall 246 and the second inner wall 248 are curved and each extend partway circumferentially around the axis 215 at the first radius. The first inner wall 246 and the second inner wall 248 cooperate to define the first portion 240 of the soldering pattern 226. The first inner wall 246 and the second inner wall 248 are configured to be bonded directly with the electrical connection pin 18A with solder or other joining material 31.

Figure 6:
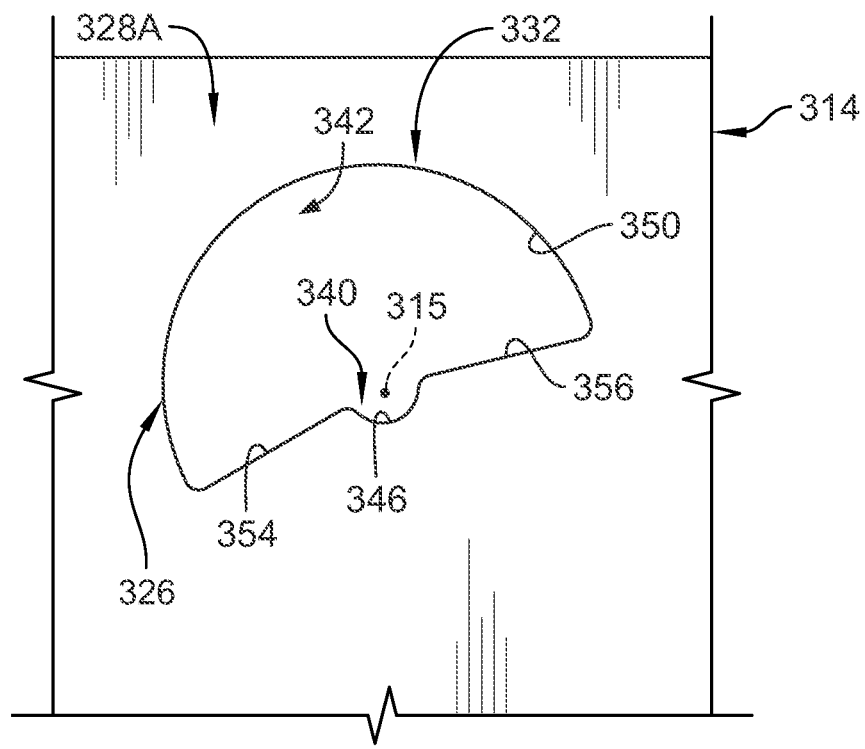
FIG. 6 is an elevation view of another solder pattern for use with the conductive layers of the multi-layer electrical component.

Another embodiment of a cutout 332 for conductive layers and having a solder pattern 326 is shown in FIG. 6. The cutout 332 is formed in a conductive layer 328A included in a plurality of conductive layers (not shown) for a multi-layer bus bar 314. Similar to the conductive layers 28, the conductive layers 328 each include a cutout having the same solder pattern 326, but with the pattern rotated partway around the axis 315 for each layer 328 so that the patterns are misaligned when viewed radially.

The soldering pattern 326 includes a first portion 340 and a second portion 342 as shown in FIG. 6. The soldering pattern 326 does not include a third portion. The first portion 340 is aligned on the axis 315 and is sized to receive the electrical connection pin 18A. The second portion 342 is located radially outward of the first portion 340 and extends at least partway about the first electrical connection pin 18A at a second radial distance relative to the axis 315.

In the illustrative embodiment, the second portion 342 extends about or more than 180 degrees around the axis 315. In other embodiments, the second portion 342 extends about or less than 180 degrees around the axis 315. In other embodiments, the second portion 342 extends about or less than 90 degrees around the axis 315. In other embodiments, the second portion 342 extends at least 90 degrees around the axis 315. In other embodiments, the second portion 342 extends about or less than 70 degrees around the axis 315. In some embodiments, the second portion 342 extends about or less than 60 degrees around the axis 315. In some embodiments, the second portion 342 extends about or less than 50 degrees around the axis 315. In some embodiments, the second portion 342 extends about or less than 45 degrees around the axis 315. In some embodiments, the second portion 342 extends about or less than 30 degrees around the axis 315.

The cutout 332 includes a first inner wall 346, a first outer wall 350, a first intermediate wall 354, and a second intermediate wall 356 as shown in FIG. 6. The first inner wall 346 is curved and extends partway circumferentially around the axis 315 at the first radius. The first inner wall 346 defines the first portion 340 of the soldering pattern 326. The first inner wall 346 is configured to be bonded directly with the electrical connection pin 18A with solder or other joining material 31. The first intermediate wall 354 extends between and interconnects the first inner wall 346 and the first outer wall 350. The second intermediate wall 356 extends between and interconnects the first inner wall 346 and the first outer wall 350. The first intermediate wall 354 and the second intermediate wall 356 diverge as they extend radially outward. The first intermediate wall 354 and the second intermediate wall 356 are generally linear.

Figure 7:
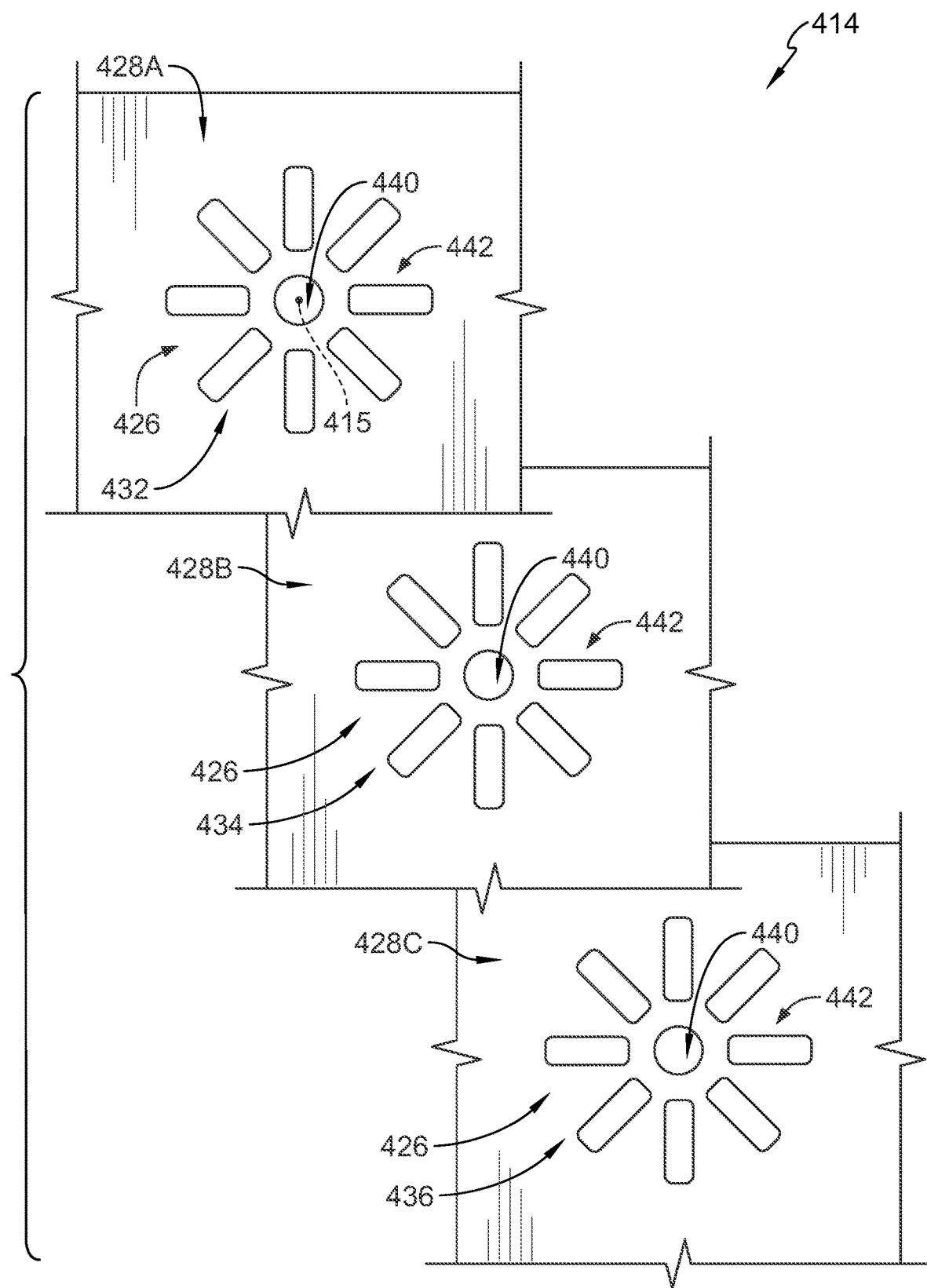
FIG. 7 is an exploded view of a plurality of conductive layers of another embodiment of the solder pattern for use with the multi-layer electrical component assembly showing that each layer is formed to define a cutout with the solder pattern whereby all solder patterns are aligned circumferentially relative to an axis for each layer.

Another embodiment of a multi-layer bus bar 414 for use with the multi-layer electrical component assembly 10 is shown in FIG. 7. The multi-layer bus bar 414 is substantially the same as the multi-layer bus bar 14 except where the description and drawings diverge from the multi-layer bus bar 14. The multi-layer bus bar 414 includes a plurality of conductive layers 428A, 428B, 428C, etc.

Each conductive layer 428A, 428B, 428C, etc. is formed to define a cutout 432, 434, 436 having a solder pattern 426 as shown in FIG. 7. Unlike the patterns 26, 226, 326, the solder patterns 426 are not rotated relative to each about the axis 415. In other embodiments, the patterns 426 on different layers are offset circumferentially. The solder patterns 426 on each conductive layer 428A, 428B, 428C, etc. are aligned circumferentially with one another. In other embodiments, the soldering patterns 426 may be partially misaligned with one another.

The soldering pattern 426 includes a first portion 440 and a plurality of second portions 442 as shown in FIG. 7. Illustratively, the first portion 440 is a central through hole 440 and the plurality of second portions 442 are a plurality of secondary holes or slots 442 arranged circumferentially around the axis 415. The first portion 440 is aligned on the axis 415 and is sized to receive the electrical connection pin 18A. The second portions 442 are located radially outward of the first portion 440 a second radial distance relative to the axis 415.

The second portions 442 are discrete relative to each other and relative to the first portion 440 as shown in FIG. 7. In other words, the second portions 442 do not open directly to each other and do not open directly into the first portion 440. illustratively, each second portion 442 is an elongated slot that extends along a major axis that extends radially away from the axis 415. The plurality of second portions 442 include eight second portions 442 in the illustrative embodiment. In other embodiments, the plurality of second portions 442 include any number of second portions 442.

Each second portion 442 has an inner end that is located about two times the radius of the first portion 440. Each second portion 442 is approximately rectangular shaped with curved edges. The second portions 442 are generally equally spaced apart from one another circumferentially about the axis 415.

Figure 8:
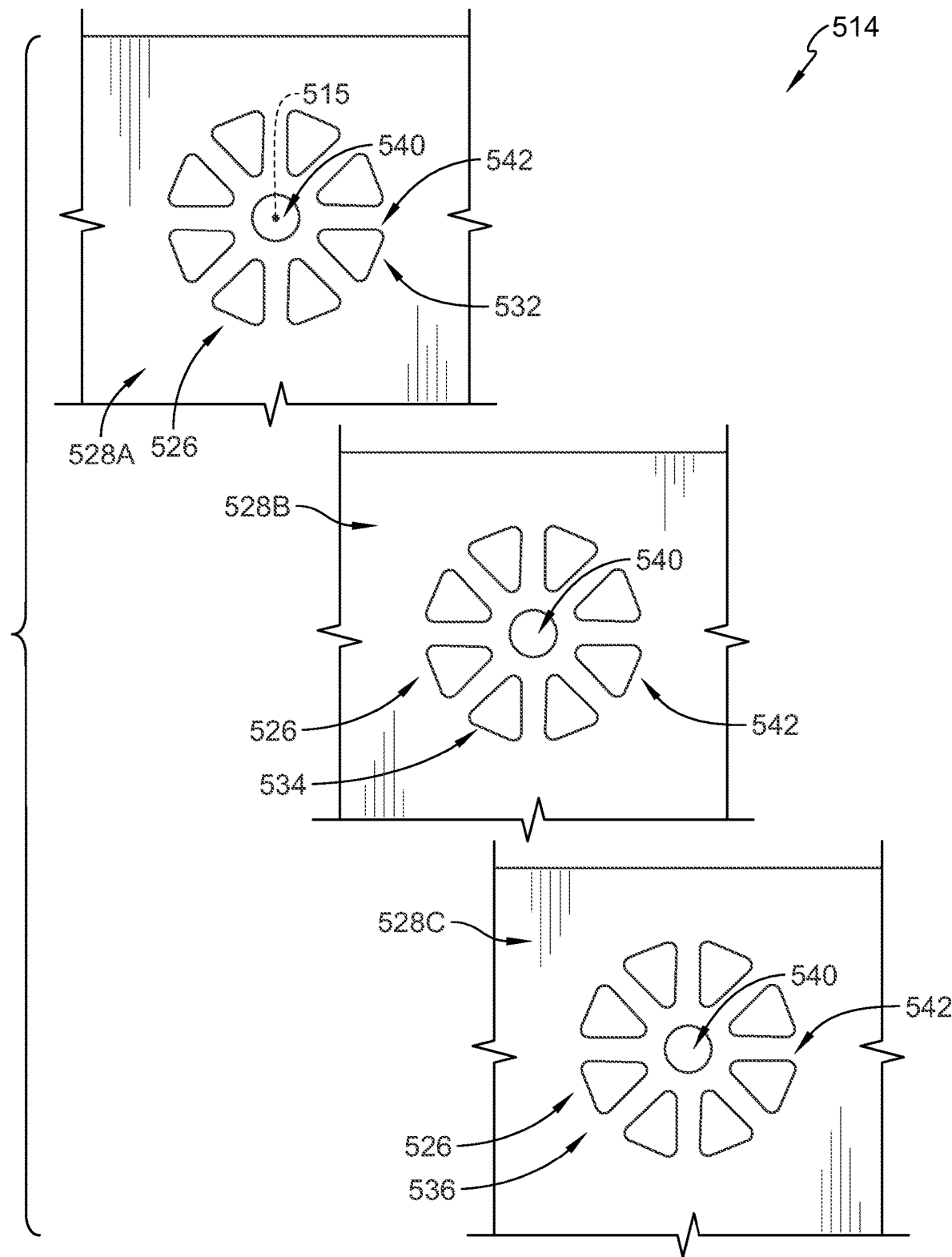
FIG. 8 is an exploded view of a plurality of conductive layers of another embodiment of the solder pattern for use with the multi-layer electrical component assembly showing that each layer is formed to define a cutout with the solder pattern whereby all solder patterns are aligned circumferentially relative to an axis for each layer.

Another embodiment of a multi-layer bus bar 514 for use with the multi-layer electrical component assembly 10 is shown in FIG. 8. The multi-layer bus bar 514 is substantially the same as the multi-layer bus bar 14 except where the description and drawings diverge from the multi-layer bus bar 14. The multi-layer bus bar 514 includes a plurality of conductive layers 528A, 528B, 528C, etc.

Each conductive layer 528A, 528B, 528C, etc. is formed to define a cutout 532, 534, 536 having a solder pattern 526 as shown in FIG. 8. The solder patterns 526 are not rotated relative to each about the axis 515. In other embodiments, the patterns 526 on different layers are offset circumferentially. The solder patterns 526 on each conductive layer 528A, 528B, 528C, etc. are aligned circumferentially with one another. In other embodiments, the soldering patterns 526 may be partially misaligned with one another.

The soldering pattern 526 includes a first portion 540 and a plurality of second portions 542 as shown in FIG. 8. Illustratively, the first portion 540 is a central through hole 540 and the plurality of second portions 542 are a plurality of secondary holes or slots 542 arranged circumferentially around the axis 515. The first portion 540 is aligned on the axis 515 and is sized to receive the electrical connection pin 18A. The second portions 542 are located radially outward of the first portion 540 a second radial distance relative to the axis 515.

The second portions 542 are discrete relative to each other and relative to the first portion 540 as shown in FIG. 8. In other words, the second portions 542 do not open directly to each other and do not open directly into the first portion 540. illustratively, each second portion 542 is wedge shaped and generally triangular. The plurality of second portions 542 include eight second portions 542 in the illustrative embodiment. In other embodiments, the plurality of second portions 542 include any number of second portions 542.

Each second portion 542 has an inner end that is located about two times the radius of the first portion 540. Each second portion 542 is approximately triangular shaped with curved edges. The second portions 542 are generally equally spaced apart from one another circumferentially about the axis 515. The second portions 542 are each substantially similar in shape and size.

A method of making a multi-layer electrical component assembly 10 such as a multi-layer bus bar assembly include arranging a first cutout 32 formed in a first electrically conductive layer 28A around an electrical connection pin 18A that extends along an axis 15. The first cutout 32 has a first portion 40 that extends circumferentially at least partway around the electrical connection pin 18A relative to the axis 15 and a second portion 42 located radially outward from the first portion 40. A second cutout 34 formed in a second electrically conductive layer 28B is arranged around the electrical connection pin 18A.

The second cutout 34 has a portion 40 that extends circumferentially at least partway around the electrical connection pin 18A relative to the axis 15 and a portion 42 located radially outward from the portion 40. Joining material 31 is applied in the first portion 40 of the first cutout 32 to cause the joining material 31 to engage the first electrically conductive layer 28A and the electrical connection pin 18A. The joining material 31 is applied to the second portion 42 of the first cutout 32 to cause a portion of the joining material 31 to pass through the second portion 42 of the first cutout 32 and enter the portion 42 of the second cutout 34 to allow the joining material 31 to engage the second electrically conductive layer 28B.

The portion 40 of the second cutout 34 is radially open to and fluidly connected with the portion 42 to allow the joining material 31 to be applied to the portion 40. The second portion 42 of the first cutout 32 has an area that is larger than an area of the first portion 40. The second cutout 34 is substantially the same shape as the first cutout 32 and rotated circumferentially partway about the axis 15 relative to first cutout 32. In some embodiments, the second cutout 434, 534 is substantially the same shape as the first cutout 432, 532 and aligned circumferentially relative to the axis 15 with the first cutout 432, 532.

The present application provides soldering through hole components to electronic components such as multi-layer laminated bus bars 14. In aerospace applications, power electronic converter designs may demand high power density in terms of weight and volume. One commonly adopted approach to reduce the DC link capacitance is to increase the power converter's switching frequency. However, with increasing switching frequency, the alternating current through the DC link capacitors increase accordingly.

With increased frequency, current crowing occurs in the DC link of conventional bus bars where the electrical current only flows to the surface of copper layers to certain depth, which is termed the skin-depth. As one illustrative example, to obtain 1 millimeter effective copper thickness, a conventional bus bar can theoretically be simply a single layer of 1 millimeter copper. However, at high frequency above 50 kHz, multiple insulated thinner layers connected in parallel would be used to obtain the 1 millimeter effective copper thickness. The multilayer laminated bus bar concept is shown in FIG. 1. The features of the present disclosure can be realized with either laminated bus bar techniques or with printed circuit boards. The multi-layer bus bar 14 may represent one of the future trend for aerospace power converters with higher and higher switching frequencies.

Film capacitors 12 in the form of rectangle packages with through-hole pins 18, as shown in FIGS. 1 and 2, may have the widest convergence of specifications including voltage ratings, unit capacitance, and unit root mean square (rms) current. Film capacitors may also have high power densities. For DC link applications, unique combinations of capacitance and root mean square current may be able to be realized with off-the-shelf models, thus allowing fast production cycle and cost saving. Film capacitors may be utilized more and more in aerospace power converters.

The combination of conventional through-hole rectangle capacitors and conventional multilayer copper bus bar or printed circuit boards create the challenge of reliable soldering. The top most layer of conventional components may be the most assessable for soldering while the inner layers may be difficult to reach with conventional soldering method. The soldering quality of conventional components may be poor where the inner layers are barely attached to the capacitor pins. Poor soldering may create high contact resistance which may lead to overheating of the contact area, melting of the insulation, and short circuit in the DC link. For multilayer printed circuit boards with thick copper, the existing conventional method to ease soldering is to pre-heat the printed circuit board and capacitors. However, soldering quality and/or solder penetration into the full thickness of the printed circuit board may be less than desirable.

According to the present disclosure, a unique layer by layer pattern 26 is provided on the copper layers 28 to create easy-to-access features as shown in FIGS. 3 and 4. Each copper layer 28 carries a thermal reliving solder pattern 26. From one copper layer 28 to the next copper layer 28, the pattern 26 is skewed by a certain degrees in some embodiments. When stacked up, the coper layers 28 together create a staircase pattern around the capacitor pin 18A. As a result, each copper layer 28 can be welded or soldered to the capacitor pin 18A separately and the bonding quality may be improved. Other thermal relieving patterns 226, 326 for copper layers are shown in FIGS. 5 and 6.

In other embodiments, the soldering patterns 426, 526 include a central through hole 440, 540 and a plurality of secondary holes or slots 442, 542 as shown in FIGS. 7-9. In the embodiment with soldering pattern 426, the pad is split into two sections to create the continuous copper condition area from the capacitor pin 18A. In the soldering pattern 526, a single section of the copper is kept for the current condition. Besides soldering irons, resistance welders or spot welders can be used to the capacitor pin soldering.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A multi-layer bus bar assembly comprising,
    a capacitor having a body and a first electrical connection pin that extends away from the body along an axis,
    a multi-layer bus bar that includes
        a positive rail that includes a plurality of first conductive layers and a plurality of first inter-insulation layers, wherein each of the plurality of first inter-insulation layers is located axially between neighboring first conductive layers included in the plurality of first conductive layers,
        a negative rail that includes a plurality of second conductive layers and a plurality of second inter-insulation layers, wherein each of the plurality of second inter-insulation layers is located axially between neighboring second conductive, and
        a main insulation layer positioned between the positive rail and the negative rail,
    wherein the plurality of first conductive layers are formed to assist in the joining of the plurality of first conductive layers with the first electrical connection pin, the plurality of first conductive layers include a first layer and a second layer axially neighboring the first layer, the first layer formed to define a first cutout shaped with a soldering pattern arranged about the axis, and the second layer formed to define a second cutout shaped with the soldering pattern, and
    wherein the soldering pattern includes a first portion that extends circumferentially at least partway around the first electrical connection pin at a first radial distance relative to the axis and a second portion that extends circumferentially at least partway about the first electrical connection pin at a second radial distance relative to the axis.

2. The multi-layer bus bar assembly of claim 1, wherein the second cutout formed in the second conductive layer is offset circumferentially about the axis relative to the first cutout formed in the first conductive layer.

3. The multi-layer bus bar assembly of claim 2, wherein the second cutout is offset circumferentially from the first cutout by less than 90 degrees relative to the axis.

4. The multi-layer bus bar assembly of claim 1, wherein the first portion of the solder pattern extends circumferentially only partway around the axis and the first distance provides the first portion with a constant radius.

5. The multi-layer bus bar assembly of claim 4, wherein the second portion of the solder pattern extends circumferentially only partway around the axis and the second distance provides the second portion with a constant radius.

6. The multi-layer bus bar assembly of claim 5, wherein the second portion of the solder pattern extends circumferentially less than 90 degrees around the axis.

7. The multi-layer bus bar assembly of claim 5, wherein the second portion of the solder pattern extends circumferentially at least 90 degrees around the axis.

8. The multi-layer bus bar assembly of claim 1, wherein the solder pattern further includes a third portion that extends circumferentially at least partway about the first electrical connection pin at a third radial distance relative to the axis and the third radial distance is greater than the first radial distance.

9. The multi-layer bus bar assembly of claim 1, wherein the first portion fluidly opens into the second portion.

10. A multi-layer electrical component assembly comprising
    an electrical connection pin that extends along an axis,
    a first conductive layer formed to define a first cutout that extends axially through the first conductive layer, and the first cutout includes a first portion arranged around the electrical connection pin and a second portion located radially outward of the first portion,
    a second conductive layer that axially neighbors the first conductive layer, the second conductive layer formed to define a second cutout that extends axially through the second conductive layer, the second cutout includes a third portion arranged around the electrical connection pin and a fourth portion located radially outward of the third portion, and the fourth portion is at least partially circumferentially aligned with the second portion of the first cutout to allow joining material to be provided axially between the fourth portion and the second portion.

11. The multi-layer electrical component assembly of claim 10, wherein the second cutout is substantially the same as the first cutout and offset circumferentially relative to the first cutout about the axis.

12. The multi-layer electrical component assembly of claim 10, wherein the first portion extends circumferentially partway about the axis at a first constant radius and the second portion extends circumferentially partway about the axis at a second constant radius that is different than the first constant radius.

13. The multi-layer electrical component assembly of claim 10, wherein the second portion opens fluidly into first portion to form a single opening through the first conductive layer.

14. The multi-layer electrical component assembly of claim 10, wherein the second portion is entirely spaced apart radially from the first portion so that each of the first portion and the second portion form an opening that extends axially through the first conductive layer.

15. The multi-layer component electrical assembly of claim 10, wherein the first cutout is defined in part by a first side wall and a second side wall that diverge as they extend radially away from the axis.

16. The multi-layer electrical component assembly of claim 10, wherein the first conductive layer includes a plurality of side walls that extend axially entirely through the first conductive layer and define the first cutout, the plurality of first side walls include a first side wall that extends circumferentially at least partway about the axis, a second side wall that extends circumferentially at least partway about the axis, and a third side wall that extends radially between and interconnects the first side wall and the second side wall.

17. A method of making a multi-layer bus bar assembly, the method comprising
- arranging a first cutout formed in a first electrically conductive layer around an electrical connection pin that extends along an axis, the first cutout having a first portion that extends circumferentially at least partway around the electrical connection pin relative to the axis and a second portion located radially outward from the first portion,
- arranging a second cutout formed in a second electrically conductive layer around the electrical connection pin, the second cutout having a third portion that extends circumferentially at least partway around the electrical connection pin relative to the axis and a fourth portion located radially outward from the second portion,
- applying joining material in the first portion of the first cutout to cause the joining material to engage the first electrically conductive layer and the electrical connection pin, and
- applying the joining material in the second portion of the first cutout to cause a portion of the joining material to pass through the second portion of the first cutout and enter the fourth portion of the second cutout to allow the joining material to engage the second electrically conductive layer.

18. The method of claim 17, wherein the third portion of the second cutout is radially open to and fluidly connected with the fourth portion to allow the joining material into the fourth portion and into the third portion.

19. The method of claim 17, wherein the second portion of the first cutout has an area that is larger than an area of the first portion.

20. The method of claim 17, wherein the second cutout is substantially the same shape as the first cutout and rotated circumferentially partway about the axis relative to first cutout.

* * * * *